United States Patent [19]

Gustafsson et al.

[11] Patent Number: 5,213,983
[45] Date of Patent: May 25, 1993

[54] METHOD FOR THE PREPARATION OF ELECTRONIC AND ELECTRO-OPTICAL COMPONENTS AND CIRCUITS USING CONDUCTIVE POLYMERS

[75] Inventors: Göran Gustafsson; Olle Inganäs, both of Lindköping; Mats Sundberg, Västerås, all of Sweden

[73] Assignee: Neste Oy, Finland

[21] Appl. No.: 630,527

[22] Filed: Dec. 20, 1990

[30] Foreign Application Priority Data

Jan. 4, 1990 [FI] Finland ..................... 900037

[51] Int. Cl.⁵ .......................................... H01L 29/28
[52] U.S. Cl. .................... 437/1; 252/182.13;
   437/180; 148/DIG. 146; 257/40
[58] Field of Search .......... 437/1, 974, 86, 163;
   148/DIG. 12, DIG. 139, DIG. 140; 357/8, 71;
   264/272.17; 252/182.13, 182.23, 182.32

[56] References Cited

U.S. PATENT DOCUMENTS

| | | | |
|---|---|---|---|
| 4,214,916 | 7/1980 | Felscher et al. | 357/8 |
| 4,532,188 | 7/1985 | Naarmann et al. | 428/500 |
| 4,609,971 | 9/1986 | Shaffer | 361/433 |
| 4,728,399 | 3/1988 | Moehwald | 204/38.3 |
| 4,929,389 | 5/1990 | Aldissi | 252/500 |

FOREIGN PATENT DOCUMENTS

| | | | |
|---|---|---|---|
| 0195380 | 9/1986 | European Pat. Off. | |
| 3421296 | 12/1985 | Fed. Rep. of Germany | 437/1 |
| 0089663 | 5/1986 | Japan | 357/8 |
| 2031175 | 2/1987 | Japan | 357/8 |

OTHER PUBLICATIONS

Ohmori et al., Jap. J. App. Phys., vol. 29, No. 5, May 1990, pp. L387–L389.
Ohmori et al., Jap. J. App. Phys., vol. 29, No. 10, Oct. 1990, pp. L1849–L1852.
Polymeric Semiconductor Contacts and Photovoltaic Applications, J. Kanicki, Handbook of Conducting Polymers, vol. 1, 5403ff (1986).
Physica Scripta. vol. 25, 863–867 (1982), O. Inganas, et al.
Synthetic Metals, vol. 28, (1989) C681 C686, S. Glenis, et al.
Synthetic Metals, vol. 25 (1988) 11–23, A. Tsumura, et al.
Nature vol. 335, Sep. 8, 1988, J. H. Burroughes, et al.
Synthetic Metals, vol. 22 (1987) 63–69, H. Tomozawa, et al.

*Primary Examiner*—Olik Chaudhuri
*Assistant Examiner*—Ken Horton
*Attorney, Agent, or Firm*—Steinberg & Raskin

[57] ABSTRACT

The invention relates to a method for the preparation of electronic and electro-optical components and circuits based on conducting polymers. One or more boundary surfaces in the component between a conducting polymer and another material are formed by melting of the conducting polymer.

9 Claims, 2 Drawing Sheets

METHOD FOR THE PREPARATION OF ELECTRONIC AND ELECTRO-OPTICAL COMPONENTS AND CIRCUITS USING CONDUCTIVE POLYMERS

BACKGROUND OF THE INVENTION

Electric components have been constructed for some time by means of conducting conjugated polymers. For example, diodes in the form of Schottky-barriers between conducting polymers and metals have been studied in detail in the publication of J. Kanicki "Polymer Semiconductor Contacts and Photovoltaic Applications" in the Handbook of Conducting Polymers, Vol. 1, 543 (1986), Ed. by T. A. Skotheim. Studies of contacts between polymers and semiconductors have also been carried out, e.g. by O. Inganäs, T. Skotheim and I. Lundström, Phys. scr. 25, 863 (1982), and by S. Glenis and A. J. Frank, Synth. Met. 28, C715 (1989).

The polymers which were studied were prepared in the form of either films on a metallic, semiconducting or insulating substrate. With respect to the need for a further contact point, this has been mounted by a vacuum steaming a metal directly onto the polymer surface. In some cases, the polymer has been directly electro-synthesized on the metal structure, which is constructed to be used as a field effect transistor, e.g. note the publication of A. Tsumura, H. Koezuka and T. Ando, Synth. Met 25, 11 (1988).

Polymers which are capable of being processed have become available lately and have also become utilized for the construction of polymer components. R. Friend in Cambridge has utilized a prepolymer for a polyacetylene, which is formed into a thin film on a substrate. The polymer is then modified into a conducting polymer for the polyacetylene in a thermic phase. The contacts with this film placed therein by steaming can be used for forming polymer components, as has been shown, e.g. by J. H. Burroughes, C. A. Jones and R. H. Friend in the publication "Nature" 335, 137 (1988). It has earlier been shown (A. Assadi, C. Svensson, M. Willander and O. Inganäs, Appl. Phys. Lett. 53, 195 (1988)), how thin thins of poly(3-alkylthiophene) can be placed on completed structures for forming field effect transistors. For forming diodes, H. Tomazawa, D. Braun, S. Phillips, A. J. Heeger and H. Kroemer, Synth. Met. 22, 63 (1987) require a contact with two separate metal surfaces. However, this cannot be formed in a simple manner by utilizing the same technique as used in the construction of field effect transistors. The most simple way is to sputter or steam a metal film directly on the surface of the conducting polymer, which in turn is already located on another metal film.

SUMMARY OF THE INVENTION

It is accordingly a primary object of the present invention to provide a simpler and more effective method of preparing components of conducting polymers.

It is yet another object of the present invention to provide a method of preparing components of conducting polymers wherein boundary surfaces in the component between the conducting polymer and another material are formed by melting the conducting polymer.

Other objects and advantages of the present invention will be apparent from a further reading of the specification and of the appended claims.

With the above and other objects in view, the present invention mainly comprises a method for the preparation of electronic and electro-optical components and circuits utilizing conducting polymers, wherein one or more boundary surfaces in the component between a conducting polymer and another material is formed by melting the conducting polymer.

Thus, the present invention describes a method wherein electronic components and circuits composed of components of the above mentioned type can be obtained by melting together a thin polymer film of a meltable conducting polymer capable of processing in its neutral position between two surfaces of metals, semiconductors or insulators. Different combinations provide different functions.

A Schottky-barrier diode can, for example, be formed by melting the polymer between two different metals. A MESFET is formed by melting the polymer between two different surfaces with a metal pattern. A MIS capacitance is formed by melting the polymer between an insulator and a metal. A MISFET transistor is formed by melting the polymer between a patterned metal film and an insulator surface. Circuits constructed with such components can of course be realized by forming surfaces with metal films and insulator films to achieve the desired function. Solar cells can also be realized by the use of the same technique.

The present invention provides the following advantages:

1. The boundary surface is formed by a simple thermal stage.
2. The polymer is not subjected to potent etching agents since the geometry of the components and the circuits is formed by etching metal patterns on a substrate.
3. It is possible to obtain boundary surfaces between the polymer and the material in a simple manner, the surfaces being obtained without steaming, sputtering, casting or spinning.

BRIEF DESCRIPTION OF THE DRAWINGS

The present invention is further illustrated in the accompanying drawings in which.

DESCRIPTION OF PREFERRED EMBODIMENTS

Figure 1:
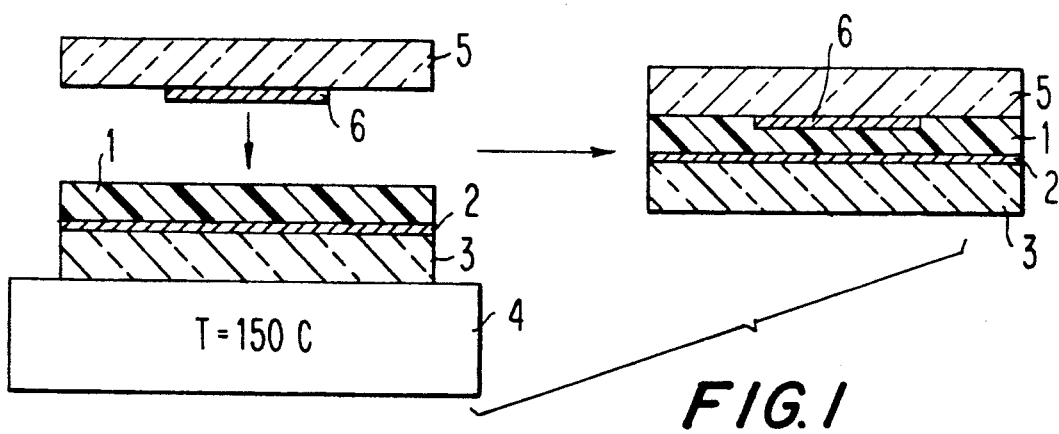
FIG. 1 illustrates a principal outline for the preparation of a Schottky-barrier structure in accordance with the method of the invention.

FIG. 1 illustrates an example of how a Schottky-barrier structure, such as Au/P3OT/Al, can be prepared by the method of the present invention.

A (poly(3-octylthiophene)) film 1 is cast from a P3OT/CHCl$_3$ solution (30 mg/ml) on a substrate 2 formed of Al (aluminum) steamed on a glass substrate 3.

The structure is placed on a heating place 4. A glass substrate 5 on which a gold layer 6 is steamed at a point located in the middle, is placed on the P3OT film 1. This "sandwich structure" is heated until the P3OT starts to soften, the structure is pressed together in such way that a relatively thick (e.g. 15-20 μm) and a homogenous P3OT layer 1 is obtained, which is in contact with the two metals 2 and 6.

The "sandwich structure" is removed from the heating plate 4 and is permitted to cool to room temperature.

Figure 2A:
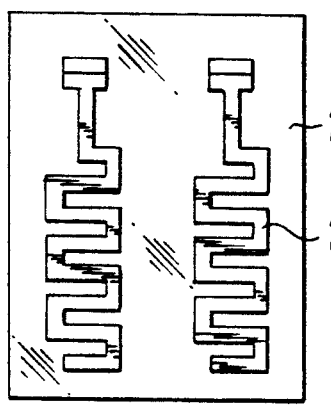
FIG. 2 illustrates the use of the method of the present invention for preparing a metal-semiconductor field effect transistor (MESFET) by melting the polymer between the two surfaces with a metal pattern.
Figure 2B:
Figure 2C:
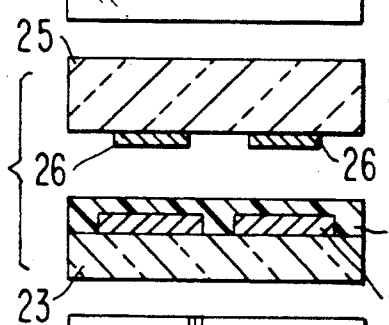

In FIG. 2, a metal semiconductor field effect transistor (MESFET) is prepared according to the invention. A meltable polymeric layer 21 is cast onto a substrate 23, on which a metal pattern 22 is steamed as illustrated in FIG. 2c. The method which is used should have an ohmic contact with the polymer. Another substrate 25 on which is steamed a pattern of another metal 26 according to as shown in FIG. 2a, is placed against the polymer layer 21 from the other side as shown in FIG. 2b. The metal that is used should give a unidirectional contact with the polymer. The "sandwich structure" is heated and completed in the same manner as in FIG. 1.

Figure 3A:
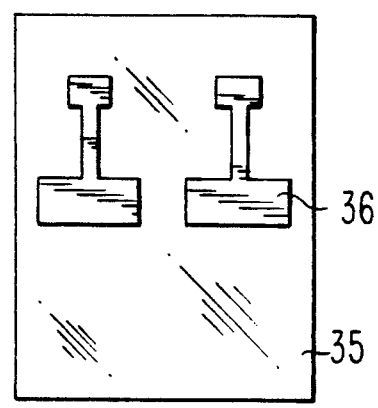
FIG. 3 illustrates the method of the present invention for the preparation of a Schottky-diode by melting the polymer between two surfaces with a metal pattern.
Figure 3B:
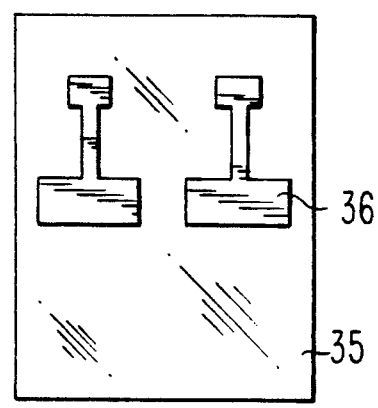
Figure 3C:
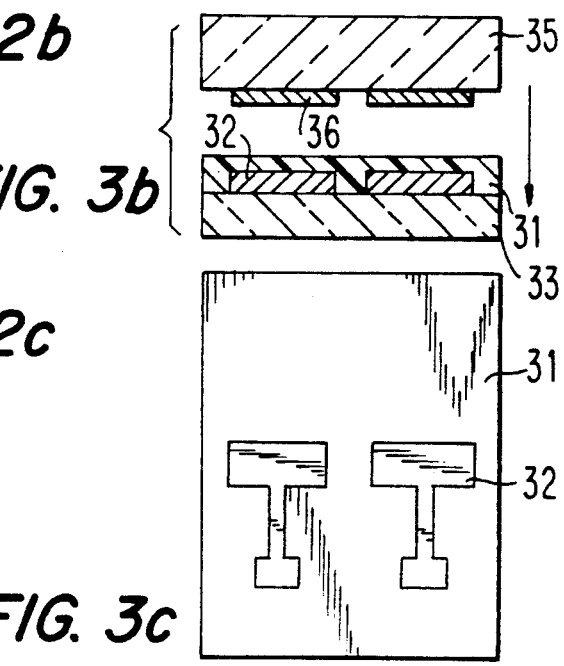

In FIG. 3, a Schottky-diode is prepared in the same way as in FIG. 2. A meltable polymer layer 31 is cast on a substrate 33, on which a metal pattern 32 is steamed as shown in FIG. 3c. The metal used in this connection provides an ohmic contact with the polymer. Another substrate 35, on which a pattern of another metal 36 is steamed as shown in FIG. 3a is placed against the polymer layer 31 from the other side as shown in FIG. 3b. The method which is used gives a unidirectional contact with the polymer. The "sandwich structure" is heated and completed according to the method of FIG. 1.

Figure 4A:
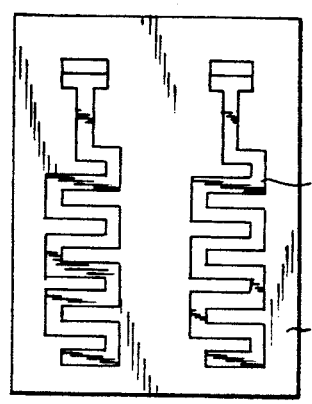
FIG. 4 illustrates the use of the method of the present invention for the preparation of a metal-insulator semiconductor field effect transistor (MISFET) by melting the polymer between two surfaces with a metal pattern, one of which surfaces is covered by an insulating layer.
Figure 4B:
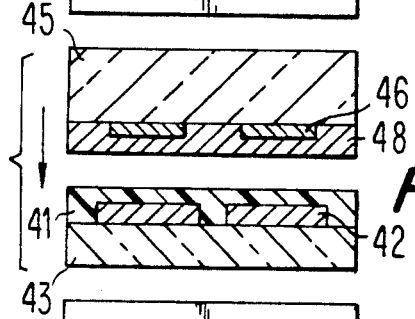
Figure 4C:
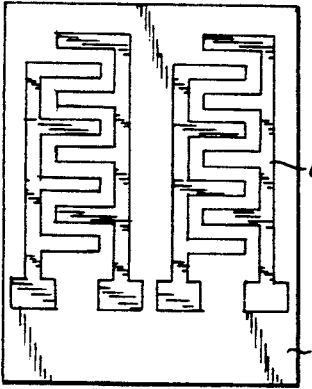

In FIG. 4, a metal insulator-semiconductor field effect transistor MISFET is prepared according to the method of the invention. A multiple polymer layer 41 is cast on a substrate 43, on which a metal pattern 42 is steamed as shown in FIG. 4c. The metal used provides a ohmic contact with the polymer. Another substrate 45, on which a pattern of another metal 46 is steamed as whon in FIG. 4a and which is covered with a layer of another insulating metal 48 is placed against the polymer layer 41 from the other side as shown in FIG. 4b. The "sandwich structure" is heated and completed in the same manner as in FIG. 1.

Figure 5A:
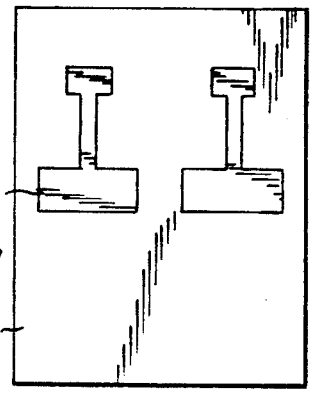
FIG. 5 illustrates the use of the method of the present invention for the preparation of a metal-insulator semiconductor (MIS) capacitance by melting the polymer between two surfaces with a metal pattern, one surface of which is covered by an insulating layer.
Figure 5B:
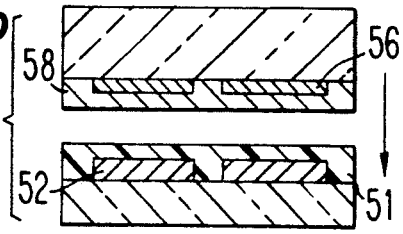
Figure 5C:
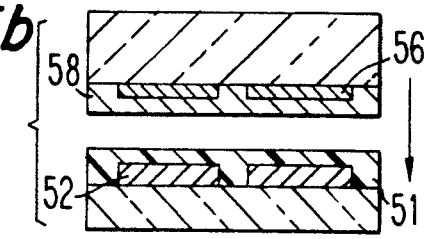

In FIG. 5, a metal insulator-semiconductor (MIS) capacitance is prepared in the same manner as in FIG. 4. A multiple polymer layer 51 is cast on a substrate 53 on which a metal pattern 53 is steamed as shown in FIG. 5c. The metal which is used provides an ohmic contact with the polymer. Another substrate 55 on which a pattern of another metal 56 is steamed in the pattern shown in FIG. 5a and which is covered with the layer of another insulating material 58, is placed against the polymer layer 51 from the other side as shown in FIG. 5b. The "sandwich structure" is heated and completed in the same manner as in FIG. 1.

The present invention provides the advantages set forth below:

1. As previously indicated, it is not necessary to subject the polymer to powerful etching agents, which are conventionally used for etching the metal pattern.

2. It is possible to obtain in a simple manner, boundary surfaces between P3AT (poly(3-alkylthiophene)) and the material does not require spinning, steaming or sputtering. For example, as in the case of Au/P3AT/Au, (it is, among other things, difficult to steam gold, since gold easily diffuses through P3AT), or optical components of the type Glass/ITO/Insulator/ P3AT/Glass.

Any metal element can be used in the present invention. The metal should provide ohmic contact. The preferred metals are Au, Cr, Ti, In or Pt.

Any inorganic or organic insulator material can be used. The preferred materials are Si, amorphous silicon hydride (a-Si:H), GaAs, CuInSe or a polymeric semiconductor.

Any meltable conducting polymer can be used. The preferred polymers are meltable poly(3-octylthiophene), poly(3-alkylthiophene), poly(alkylthiophene vinyl), polyalkylpyrrolidine or the like.

The invention has been illustrated with respect to certain specific embodiments. It is to be understood, however, that the invention is not meant to be limited to the specific details of the examples.

What is claimed is:

1. Method for the preparation of electronic and electro-optical components and circuits, which comprises melting a meltable conducting polymer in contact with at least one substrate surface of a material other than the conducting polymer to form a boundary surface between the conducting polymer and said other material.

2. Method according to claim 1 wherein a boundary surface between said conducting polymer and said other material which is a metal is formed by pressing the surfaces of the conducting polymer and the metal against each other under sufficient heat to melt the polymer, whereby the polymer and the metal become fixed to each other.

3. Method according to claim 1 wherein the other material is an insulating material and the boundary surface is formed by pressing the polymer and insulating material against each other under sufficient heat to melt the polymer in such manner that the polymer and insulator become fixed to each other.

4. Method according to claim 1 wherein the other material is a semiconductor and the boundary surface is formed by pressing the conducting polymer and semiconductor together under sufficient heat to melt the polymer whereby the conducting polymer becomes fixed to the semiconductor.

5. Method according to claim 2 wherein the metal provides ohmic contact with the contacting polymer.

6. Method according to claim 2 wherein the metal is Au, Cr, Ti, In or Pt.

7. Method according to claim 3 wherein the insulator is an inorganic or polymeric insulator.

8. Method according to claim 4 wherein the semiconductor is Si, an amorphous silicon hydride (a-Si;H), GaAs, CuInSe or a polymer semiconducting polymer.

9. Method according to claim 1 wherein the conducting polymer is a meltable poly(3-octylthiophene), poly(3-alkylthiophene), poly(alkylthiophene vinyl) or polyalkylpyrrolidine.

* * * * *